(12) United States Patent
Kasai et al.

(10) Patent No.: US 6,232,034 B1
(45) Date of Patent: May 15, 2001

(54) LITHOGRAPHIC PRINTING PLATE PRECURSOR AND METHOD FOR THE PREPARATION OF LITHOGRAPHIC PRINTING PLATE EMPLOYING THE SAME

(75) Inventors: Seishi Kasai; Eiichi Kato, both of Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/218,241

(22) Filed: Dec. 22, 1998

(30) Foreign Application Priority Data

Dec. 26, 1997 (JP) .................................................... 9-361253

(51) Int. Cl.$^7$ ..................................................... G03F 7/075
(52) U.S. Cl. ......................................... 430/270.1; 430/302
(58) Field of Search .............................. 430/270.1, 272.1, 430/302

(56) References Cited

U.S. PATENT DOCUMENTS

| | | | |
|---|---|---|---|
| 3,971,660 | * | 7/1976 | Staehle ...................................... 96/33 |
| 5,084,344 | * | 1/1992 | Harada et al. ......................... 428/334 |
| 5,624,777 | * | 4/1997 | Kato et al. .............................. 430/96 |
| 6,082,263 | * | 7/2000 | Koguchi et al. ...................... 101/456 |

FOREIGN PATENT DOCUMENTS

| | | | |
|---|---|---|---|
| 11091255 | * | 4/1999 | (JP) ................................. B41N/1/14 |
| 11115335 | * | 4/1999 | (JP) ................................. B41N/1/14 |

* cited by examiner

*Primary Examiner*—Cynthia Hamilton
*Assistant Examiner*—Barbara Gilmore
(74) *Attorney, Agent, or Firm*—Reed Smith LLP

(57) ABSTRACT

A lithographic printing plate precursor for ultraviolet ray exposure comprising a support having provided thereon a light-sensitive layer containing fine anatase-type titanium oxide grains and a resin having a siloxane bond represented by the following formula (I):

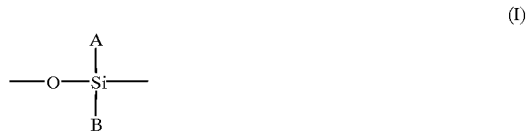

wherein A and B, which may be the same or different, each represents —O—, a hydrogen atom, a hydrocarbon group or a heterocyclic group.

The lithographic printing plate precursor can provide a lithographic printing plate only by imagewise exposure to ultraviolet ray without undergoing any wet process, for example, desensitizing treatment, sensitizing treatment or alkaline processing.

A method for the preparation of a lithographic printing plate using the lithographic printing plate precursor is also disclosed.

9 Claims, No Drawings

LITHOGRAPHIC PRINTING PLATE PRECURSOR AND METHOD FOR THE PREPARATION OF LITHOGRAPHIC PRINTING PLATE EMPLOYING THE SAME

FIELD OF THE INVENTION

The present invention relates to a novel process less lithographic printing plate precursor which provides a lithographic printing plate only by imagewise exposure without undergoing development processing and a method for the preparation of a lithographic printing plate employing the same.

BACKGROUND OF THE INVENTION

Lithographic printing plate precursors mainly employed in the field of small-scale commercial printing include (1) a direct drawing type printing plate precursor comprising a water-resistant support having provided thereon a hydrophilic image-receiving layer, (2) a printing plate precursor comprising a water-resistant support having provided thereon an oleophilic image-receiving layer containing zinc oxide, which is subjected to desensitizing treatment with a desensitizing solution after image formation to render the non-image area hydrophilic, thereby providing a printing plate, (3) a printing plate precursor of an electrophotographic light-sensitive material comprising a water-resistant support having provided thereon a photoconductive layer containing photoconductive zinc oxide, which is subjected to desensitizing treatment with a desensitizing solution after image formation to render the non-image area hydrophilic, thereby providing a printing plate, (4) a printing plate precursor of silver halide photographic material comprising a water-resistant support having provided thereon a silver halide emulsion layer, (5) a presensitized printing (PS) plate comprising an aluminum support having a hydrophilic surface having provided thereon a layer capable of forming a resin image upon exposure to ultraviolet ray, and (6) a water-less presensitized printing (PS) plate comprising an aluminum support having provided thereon a photosensitive layer containing a photosensitive resin and a silicone rubber layer.

However, these printing plate precursors have problems, respectively. For instance, although printing plate precursors of type (1) are simple, they may not reach the satisfactory level in view of image qualities and background stains in the non-image areas required to prints, and printing durability (i.e., press-life). On the other hand, wet processing such as desensitizing treatment or sensitizing treatment is required in case of using printing plate precursors of type (2), (3) and (4), and further treatment with an aqueous alkaline solution or an aqueous organic solvent solution is indispensable in case of using printing plate precursors (5) and (6) in order to form printing plates so that increased cost due to employing complicated and large-sized machines for the treatment and undesirable influence on environment caused by waste materials such as exhausted treating solutions are accompanied.

Recently, in the field of printing, computerization of plate-making steps has rapidly proceeded, and a plate-making system in which layout of letters, images and likes is determined on a computer and the information is directly output from an output device to a printing plate precursor draws attention.

Specifically, it is possible to directly produce a printing plate from digital data by exposure with laser beam without using intermediate films and conventional optical printing methods. As the result, lithographic printing plate precursors which do not need wet processing such as desensitizing treatment or sensitizing treatment, development processing with an aqueous alkaline solution or an aqueous organic solvent solution and baking treatment have been proposed.

Examples thereof include a printing plate precursor having a heat-sensitive layer comprising a polymer containing heat-decomposable carboxylic ester groups associated with a compound capable of converting light to heat, which forms a printing plate by exposure with heat laser to decompose the ester groups to generate carboxy groups, thereby rendering its surface hydrophilic, without wet processing, as described in EP-652,483; a printing plate precursor having a hydrophobic resin surface containing a compound capable of converting light to heat, which forms a printing plate by sulfonating to render its whole surface hydrophilic and exposing with heat laser to remove the sulfonic groups by heating, thereby rendering its surface hydrophobic to form an image as described in JP-A-60-132760 (the term "JP-A" as used herein means an "unexamined published Japanese patent application"); a printing plate precursor having a photosensitive layer containing a electroconductive polymer, which forms a printing plate by scanning electochemical or electric signal, thereby converting hydrophilic-hydrophobic property of its surface as described in EP-279,066; and a printing plate precursor comprising zirconia ceramic, which forms a printing plate by exposing its surface with heat laser to convert oxidation state of the oxide, thereby changing its surface property from hydrophilic to hydrophobic as described in EP-769,372.

However, these lithographic printing plate precursors have one or more disadvantages which restrict practical use.

For example, difference in a property between an oleophilic image portion and a hydrophilic non-image portion is not large enough in many cases and fatal defect in that background stains occur in prints or printing ink dose not sufficiently adhere on the image portion is accompanied. Also, dampening water used for printing is restricted. Further, materials contained in the printing plate precursors may cause problems due to their poor storage stability.

SUMMARY OF THE INVENTION

Therefore, the present invention has been made in order to overcome the many problems and restriction in the prior art described above.

Specifically, an object of the present invention is to provide a lithographic printing plate precursor which can form a lithographic printing plate only by image formation on ultraviolet ray exposure.

Another object of the present invention is to provide a lithographic printing plate precursor for ultraviolet ray exposure which provides a lithographic printing plate in a simple and cheap manner without undergoing wet process such as desensitizing treatment, sensitizing treatment or alkaline processing.

A further object of the present invention is to provide a method for the preparation of a lithographic printing plate only by imagewise exposure to ultraviolet ray.

Other objects of the present invention will become apparent from the following description.

It has been found that these objects of the present invention are accomplished by a lithographic printing plate precursor for ultraviolet ray exposure comprising a support having provided thereon a light-sensitive layer containing fine anatase-type titanium oxide grains and a resin having a siloxane bond represented by the following formula (I):

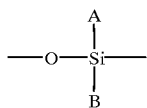

(I)

wherein A and B, which may be the same or different, each represents —O—, a hydrogen atom, a hydrocarbon group or a heterocyclic group.

The present invention also provide a method for the preparation of a lithographic printing plate comprising exposing imagewise the lithographic printing plate precursor describe above to ultraviolet ray to render the surface of the imagewise exposed area of the light-sensitive layer hydrophilic.

DETAILED DESCRIPTION OF THE INVENTION

The present invention exploits polar conversion of fine anatase-type titanium oxide grains from the oleophilic condition to the hydrophilic condition. The lithographic printing plate precursor according to the present invention is characterized by having a light-sensitive layer containing fine anatase-type titanium oxide grains and a resin having a siloxane bond and providing a lithographic printing plate only by imagewise exposure with ultraviolet ray.

The anatase-type titanium oxide grains used in the present invention have a feature in that they are photo excited upon irradiation with ultraviolet ray to render their surfaces hydrophilic. The phenomenon of changing a surface property of anatase-type titanium oxide grain to the hydrophilic condition upon irradiation with ultraviolet ray is described in detail, for example, in Toshiya Watanabe, Ceramics, Vol. 31, No. 10, page 837 (1966). However, there is no description on a lithographic printing plate precursor. It is believed that the application of the phenomenon to the technical field of lithographic printing is new and brings a great advance in the art.

The resin having a siloxane bond is advantageous in view of providing a large film-strength of the light-sensitive layer and forming a uniform dispersion of the titanium oxide grains. It is particularly true when the light-sensitive layer is formed by a sol-gel method.

The lithographic printing plate precursor is imagewise irradiated with laser beam having absorption in an ultraviolet region to form an image pattern on the surface of the light-sensitive layer, whereby a lithographic printing plate is prepared.

The lithographic printing plate precursor according to the present invention has many advantages in comparison with conventionally known lithographic printing plate precursors.

Specifically, since chemical treatment is not employed for the preparation of a lithographic printing plate, trouble, expenditure and undesirable influence on environment resulting from using a desensitizing treatment solution containing potassium ferrocyanide or an aqueous alkaline developing solution are avoided. Further, a lithographic printing plate can be directly prepared by conducting ultraviolet ray exposure based on digital data to the lithographic printing plate precursor according to the present invention without employing intermediate films and conventional optical printing method. Moreover, the lithographic printing plate prepared from the lithographic printing plate precursor of the present invention can be reused. Specifically, after removing printing ink from the surface of the printing plate, the printing plate is subjected to heat treatment, whereby the hydrophilic non-image portion returns to the inherent hydrophobic state and the resulting printing plate precursor is repeatedly employed.

Now, the lithographic printing plate precursor of the present invention will be described in more detail below.

The light-sensitive layer of the lithographic printing plate precursor is inherently hydrophobic. A contact angle of the surface of the light-sensitive layer with water is ordinarily at least 30 degrees, preferably from 40 to 110 degrees, and more preferably from 50 to 95 degrees. The contact angle of the surface of the light-sensitive layer with water is determined in the following manner. Two $\mu l$ of distilled water is put on the surface of the light-sensitive layer at room temperature (from 15 to 35° C.) and 30 seconds after, the contact angle of the surface of the light-sensitive layer with water is measured by a surface contact meter (CA-D manufactured by Kyowa Kaimen Kagaku Co., Ltd.). The contact angle with water described in the specification is determined in the above manner.

The light-sensitive layer contains the fine anatase-type titanium oxide grains preferably in a range of from 30 to 95% by weight, more preferably in a range of from 50 to 80% by weight in order to well utilize the effect of the fine anatase-type titanium oxide grains. In the above described range, the surface of the light-sensitive layer is occupied with the anatase-type titanium oxide grains sufficient for obtaining the desired hydrophilicity upon the ultraviolet ray exposure. When the content of the anatase-type titanium oxide grains is less than 30% by weight, the surface of the light-sensitive layer may not become sufficiently hydrophilic. On the other hand, the content exceeds 95% by weight, the light-sensitive layer tends to become brittle.

The titanium oxide grains used in the present invention comprise those having the crystal structure of anatase type, and have a feature in that they are photo excited upon irradiation with ultraviolet ray to render their surfaces hydrophilic as described above.

The average particle size of the anatase-type titanium oxide grains is preferably from 5 to 500 nm, more preferably from 5 to 100 nm. In such a range, the surface of titanium oxide grain can get appropriate hydrophilicity by irradiation with ultraviolet ray.

The anatase-type titanium oxide grains are commercially available as powder or a titania sol dispersion manufactured, e.g., by Ishihara Sangyo Kaisha, Ltd., Titan Kogyo Kabushiki Kaisha, Sakai Chemical Industry Co., Ltd., Japan Aerosil Inc., or Nissan Chemical Industries, Ltd.

Further, the anatase-type titanium oxide grains used in the present invention may further contain other metallic elements or oxides thereof. The term "contain" used herein includes the meanings of "cover the grain surface" and/or "carry in the inner part", and "dope in the inner part".

Examples of the other metallic element which may be contained in the titanium oxide grains include Si, Mg, V, Mn, Fe, Sn, Ni, Mo, Ru, Rh, Re, Os, Cr, Sb, In, Ir, Ta, Nb, Cs, Pd, Pt and Au. Specific examples thereof are described, e.g., in JP-A-7-228738, JP-A-7-187677, JP-A-8-81223, JP-A-8-257399, JP-A-8-283022, JP-A-9-25123, JP-A-9-71437 and JP-A-9-70532.

The proportion of the other metallic element or oxide thereof which may be contained in the anatase-type titanium oxide grains is preferably not more than 10% by weight, more preferably not more than 5% by weight, based on the total anatase-type titanium oxide grains.

The light-sensitive layer may contain inorganic pigment particles other than the anatase-type titanium oxide grains according to the present invention. Examples of such inorganic pigment particles include silica, alumina, kaolin, clay, zinc oxide, calcium carbonate, barium carbonate, calcium sulfate, barium sulfate, magnesium carbonate, and titanium oxide having a crystal structure other than the anatase type. The inorganic pigment particles are used preferably less than 40 parts by weight, more preferably not more than 30 parts by weight, based on 100 parts by weight of the anatase-type titanium oxide grains according to the present invention.

The main component of the resin used in the light-sensitive layer is a polysiloxane resin having the siloxane bond represented by the formula (I) described above.

The siloxane bond represented by the formula (I) in the resin according to the present invention specifically includes bonds shown below and one or more kings of these bonds can be contained in the resin.

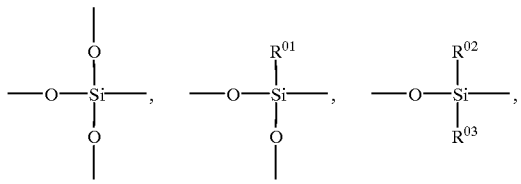

In the formula above, $R^{O1}$, $R^{O2}$ and $R^{O3}$, which may be the same or different, each represents a hydrogen atom, a hydrocarbon group or a heterocyclic group.

The hydrocarbon group and heterocyclic group represented by A, B, $R^{O1}$, $R^{O2}$ and $R^{O3}$ are same as those represented by Ro in the formula (II) described below.

Preferably, the light-sensitive layer is formed from a dispersion comprising the anatase-type titanium oxide grains and at least one silane compound represented by the following formula (II) by a sol-gel method:

$(R^O)_n Si(Y)_{4-n}$ (II)

wherein $R^O$ represents a hydrogen atom, a hydrocarbon group or a heterocyclic group; Y represents a hydrogen atom, a halogen atom or a group of formula $—OR^1$, $—OCOR^2$ or $—N(R^3)(R^4)$, wherein $R^1$ and $R^2$ each represents a hydrocarbon group, and $R^3$ and $R^4$, which may be the same or different, each represents a hydrogen atom or a hydrocarbon group; and n represents 0, 1, 2 or 3.

In the formula (II) examples of the group represented by $R^O$ include, preferably, a hydrogen atom, an unsubstituted or substituted straight chain or branched chain alkyl group having from 1 to 12 carbon atoms [e.g., methyl, ethyl, propyl, butyl, pentyl, hexyl, heptyl, octyl, nonyl, decyl and dodecyl groups, which each may have one or more substituents, such as a halogen atom (e.g., chlorine, fluorine or bromine atom), a hydroxy group, a thiol group, a carboxy group, a sulfo group, a cyano group, an epoxy group, an —OR' group (wherein R' represents a hydrocarbon group, e.g., methyl, ethyl, propyl, butyl, heptyl, hexyl, octyl, decyl, propenyl, butenyl, hexenyl, octenyl, 2-hydroxyethyl, 3-chloropropyl, 2-cyanoethyl, N,N-dimethylaminoethyl, 2-bromoethyl, 2-(2-methoxyethyl)-oxyethyl, 2-methoxycarbonylethyl, 3-carboxypropyl or benzyl), an —OCOR" group (wherein R" has the same meaning as R'), a —COOR" group, a —COR" group, an —N(R''')$_2$ group [wherein R''', which may be the same or different, each represents a hydrogen atom or a group same as defined for R', an —NHCONHR" group, an —NHCOOR" group, a —SiR"$_3$ group, a —CONHR''' group and a —NHCOR" group]; an unsubstituted or substituted straight chain or branched chain alkenyl group having from 2 to 12 carbon atoms [e.g., vinyl, propenyl, butenyl, pentenyl, hexenyl, octenyl, decenyl and dodecenyl groups, which each may have one or more substituents selected from those described for the foregoing alkyl group]; an unsubstituted or substituted aralkyl group having from 7 to 14 carbon atoms [e.g., benzyl, phenetyl, 3-phenylpropyl, naphthylmethyl and 2-naphthylethyl groups, which each may have one ore more substituents selected from those described for the foregoing alkyl group]; an unsubstituted or substituted alicyclic group having from 5 to 10 carbon atoms [e.g., cyclopentyl, cyclohexyl, 2-cyclohexylethyl, 2-cyclopentylethyl, norbornyl and adamantyl groups, which each may have one or more substituents selected from those described for the foregoing alkyl group]; an unsubstituted or substituted aryl group having 6 to 12 carbon atoms [e.g., phenyl and naphthyl groups, which each may have one or more substituents selected from those described for the foregoing alkyl group]; or an unsubstituted or substituted heterocyclic group which may have a condensed ring, containing at least one atom selected from nitrogen, oxygen and sulfur atoms [examples of the hetero ring include an unsubstituted or substituted pyran, furan, thiophene, morpholine, pyrrole, thiazole, oxazole, pyridine, piperidine, pyrrolidone, benzothiazole, benzoxazole, quinoline or tetrahydrofuran ring, which may have one or more substituents selected from those described for the foregoing alkyl group].

Examples of the group represented by Y in the formula (II) include a halogen atom (e.g., fluorine, chlorine, bromine or iodine atom), or a group of formula $—OR^1$, $—OCOR^2$ or $—NR^3R^4$.

In the group of $—OR^1$, $R^1$ represents an unsubstituted or substituted aliphatic group having from 1 to 10 carbon atoms (e.g., methyl, ethyl, propyl, butyl, pentyl, hexyl, heptyl, octyl, nonyl, decyl, propenyl, butenyl, heptenyl, hexenyl, octenyl, decenyl, 2-hydroxyethyl, 2-hydroxypropyl, 2-methoxyethyl, 2-(methoxyethyloxy)ethyl, 2-(N,N-diethylamino)ethyl, 2-methoxypropyl, 2-cyanoethyl, 3-methyloxypropyl, 2-chloroethyl, cyclohexyl, cyclopentyl, cyclooctyl, chlorocyclohexyl, methoxycyclohexyl, benzyl, phenetyl, dimethoxybenzyl, methylbenzyl, or bromobenzyl).

In the group of $—OCOR^2$, $R^2$ represents an aliphatic group as defined for $R^1$, or an unsubstituted or substituted aromatic group having from 6 to 12 carbon atoms (e.g., aryl groups as described for the forgoing $R^O$).

In the group of $—NR^3R^4$, $R^3$ and $R^4$, which may be the same or different, each represents a hydrogen atom or an unsubstituted or substituted aliphatic group having from 1 to 10 carbon atoms (e.g., aliphatic groups as described for $R^1$ in the foregoing group $—OR^1$).

More preferably, the total number of carbon atoms contained in $R^3$ and $R^4$ are 16 or less.

Specific examples of the silane compound represented by the formula (II) are set forth below, but the present invention should not be construed as being limited thereto. methyltrichlorosilane, methyltribromosilane, methyltrimethoxysilane, methyltriethoxysilane, methyltriisopropoxysilane, methyltri(tert-butoxy)silane, ethyltrichlorosilane, ethyltribromosilane, ethyltrimethoxysilane, ethyltriethoxysilane, ethyltriisopropoxysilane, ethyltri(tert-butoxy)silane, n-propyltrichlorosilane, n-propyltribromosilane, n-propyltrimethoxysilane, n-propyltriethoxysilane, n-propyltriisopropoxysilane, n-propyltri(tert-butoxy)silane, n-hexyltrichlorosilane, n-hexyltribromosilane, n-hexyltrimethoxysilane, n-hexyltriethoxysilane, n-hexyltriisopropoxysilane, n-hexyltri(tert-butoxy)silane, n-decyltrichlorosilane, n-decyltribromosilane, n-decyltrimethoxysilane, n-decyltriethoxysilane, n-decyltriisopropoxysilane, n-decyltri(tert-butoxysilane), n-octadecyltrichlorosilane, n-octadecyltribromosilane, n-octadecyltrimethoxysilane, n-octadecyltriethoxysilane, n-octadecyltriisopropoxysilane, n-octadecyltri(tert-butoxy)silane, phenyltrichlorosilane, phenyltribromosilane, phenyltrimethoxysilane, phenyltriethoxysilane, phenyltriisopropoxysilane, phenyltri(tert-butoxy)silane, tetrachlorosilane, tetrabromosilane, tetramethoxysilane, tetraethoxysilane, tetraisopropoxysilane, tetrabutoxysilane, dimethoxydiethoxysilane, dimethyldichlorosilane, dimethyldibromosilane, dimethyldimethoxysilane, dimethyldiethoxysilane, diphenyldichlorosilane, diphenyldibromosilane, diphenyldimethoxysilane, diphenyldiethoxysilane, phenylmethyldichlorosilane, phenylmethyldibromosilane, phenylmethyldimethoxysilane, phenylmethyldiethoxysilane, triethoxyhydrosilane, tribromohydrosilane, trimethoxyhydrosilane, triisopropoxyhydrosilane, tri(tert-butoxy)hydrosilane, vinyltrichlorosilane, vinyltribromosilane, vinyltrimethoxysilane, vinyltriethoxysilane, vinyltriisopropoxysilane, vinyltri(tert-butoxy)silane, trifluoropropyltrichlorosilane, trifluoropropyltribromosilane, trifluoropropyltrimethoxysilane, trifluoropropyltriethoxysilane, trifluoropropyltriisopropoxysilane, trifluoropropyltri(tert-butoxy)silane, γ-glycidoxypropylmethyldimethoxysilane, γ-glycidoxypropylmethyldiethoxysilane, γ-glycidoxypropyltrimethoxysilane, γ-glycidoxypropyltriethoxysilane, γ-glycidoxypropyltriisopropoxysilane, γ-glycidoxypropyltri(tert-butoxy)silane, γ-methacryloxypropylmethyldimethoxysilane, γ-methacryloxypropylmethyldiethoxysilane, γ-methacryloxypropylmethoxysilane, γ-methacryloxypropyltriisopropoxysilane, γ-methacryloxypropyltri(tert-butoxy)silane, γ-aminopropylmethyldimethoxysilane, γ-aminopropylmethyldiethoxysilane, γ-aminopropyltrimethoxysilane, γ-aminopropyltriethoxysilane, γ-aminopropyltriisopropoxysilane, γ-aminopropyltri(tertbutoxy)silane, γ-mercaptopropylmethyldimethoxysilane, γ-mercaptopropylmethyldiethoxysilane, γ-mercaptopropyltrimethoxysilane, γ-mercaptopropyltriethoxysilane, γ-mercaptopropyltriisopropoxysilane, γ-mercaptopropyltri(tert-butoxy)silane, β-(3,4-epoxycyclohexyl)ethyltrimethoxysilane and β-(3,4-epoxycyclohexyl)ethyltriethoxysilane.

In combination with the silane compound represented by the formula (II) which is used for the formation of the light-sensitive layer according to the present invention, a metallic compound capable of forming film by a sol-gel method such as Ti, Zn, Sn, Zr, Al or Ni compound can be employed. Specific examples of the metallic compound usable in combination include Ti(OR″) (wherein R″ represents an alkyl group such as methyl, ethyl, propyl, butyl, pentyl, or hexyl), $TiCl_4$, $Zn(OR″)_2$, $Zn(CH_3COCHCOCH_3)_2$, $Sn(OR″)_4$, $Sn(CH_3COCHCOCH_3)_4$, $Sn(OCOR″)_4$, $SnCl_4$, $Zr(OR″)_4$, $Zr(CH_3COCHCOCH_3)_4$, $Al(OR″)_3$ and $Ni(CH_3COO)_4$.

The metallic compound can be employed in such an amount that uniformity and strength of the film formed by the sol-gel method are sufficiently maintained.

In the light-sensitive layer according to the present invention, a ratio of the anatase-type titanium oxide grains to the resin having a siloxane bond is preferably from 30/70 to 95/5 by weight, more preferably from 50/50 to 80/20 by weight.

In such a range, the film-strength of the light-sensitive layer and the hydrophilicity of the surface after irradiation with ultraviolet ray can be retained satisfactorily during printing and a large number of prints having clear images without background stain can be obtained.

The light-sensitive layer according to the present invention is preferably formed by a sol-gel method. The sol-gel method employed in the present invention may be any of conventionally well-known methods.

More specifically, the light-sensitive layer can be formed using the methods described in detail, for example, in Sumio Sakibana, *Science of Sol-Gel Method*, Agne Showfu-sha (1988), and Seki Hirashima, *Latest Arts of Functional Thin Film Formation using Sol-Gel Method*, Sogo Gijutu Center (1992).

In a coating solution for the light-sensitive layer, water is used as a solvent. A water-soluble solvent is also employed together with water in order to prevent precipitation during the preparation of coating solution, thereby forming a uniform solution. Examples of the water-soluble solvent include an alcohol (such as methanol, ethanol, propyl alcohol, ethylene glycol, diethylene glycol, propylene glycol, dipropylene glycol, ethylene glycol monomethyl ether, propylene glycol monomethyl ether and ethylene glycol monoethyl ether), an ether (such as tetrahydrofuran, ethylene glycol dimethyl ether, propylene glycol dimethyl ether and tetrahydrofuran), a ketone (such as acetone, methyl ethyl ketone and acetylacetone), an ester (such as methyl acetate and ethylene glycol monomethyl monoacetate) and an amide (such as formamide, N-methylformamide, pyrrolidone and N-methylpyrrolidone). The solvent may be used individually or as a mixture of two or more thereof.

In the coating solution, it is preferred to further use an acidic or basic catalyst for the purpose of accelerating the hydrolysis and polycondensation reaction of the silane compound represented by the formula (II) and the above described metallic compound used in combination therewith.

The catalyst used for the above purpose is an acidic or basic compound itself or an acidic or basic compound dissolved in a solvent, such as water or an alcohol (such a compound is hereinafter referred to as an acidic catalyst or a basic catalyst respectively). The concentration of catalyst is not particularly limited, but the high catalyst concentration tends to increase the hydrolysis speed and the polycondensation speed. Since the basic catalyst used in a high concentration may cause precipitation in the sol solution, however, it is desired that the basic catalyst concentration be not higher than one normal (1N), as a concentration in the aqueous solution.

The acidic catalyst or the basic catalyst used has no particular restriction as to the species. In the case where the use of a catalyst in a high concentration is required, however, a catalyst constituted of elements which leave no residue in the crystal grains after sintering is preferred. Suitable examples of the acidic catalyst include a hydrogen halide (e.g., hydrogen chloride), nitric acid, sulfuric acid, sulfurous acid, hydrogen sulfide, perchloric acid, hydrogen peroxide, carbonic acid, a carboxylic acid (e.g., formic acid or acetic acid), a substituted carboxylic acid represented by the formula of RCOOH wherein R is an element or a substituent other than H— and $CH_3$—), and a sulfonic acids (e.g., benzenesulfonic acid). Suitable examples of the basic catalyst include an ammoniacal base (e.g., aqueous ammonia) and an amine (e.g., ethylamine or aniline).

The coating solution thus prepared is coated on a support using any of conventional well-known coating methods and dried to form a light-sensitive layer.

The thickness of the light-sensitive layer is preferably from 0.2 to 10 $\mu$m, more preferably from 0.5 to 8 $\mu$m. In such a thickness range, the layer formed can have a uniform thickness and sufficient film strength.

Examples of the support which can be used in the present invention include an aluminum plate, a zinc plate, a bimetal plate such as a copper-aluminum plate, a copper-stainless steel plate or a chromium-copper plate, and a trimetal plate such as a chromium-copper-aluminum plate, chromium-lead-iron plate or a chromium-copper-stainless steel plate, which each has a thickness of preferably from 0.1 to 3 mm, particularly preferably from 0.1 to 1 mm. Also, 80–200 $\mu$m thick paper subjected to water-resistant treatment, plastic film or metal foil-laminated paper or a plastic film can be used as the support.

As to the support used in the present invention, the smoothness of its surface on the side adjacent to the light-sensitive layer is adjusted to preferably at least 300 (second/10 ml), more preferably from 900 to 3,000 (second/10 ml) and particularly preferably from 1,000 to 3,000 (second/10 ml) in the Bekk smoothness.

The Bekk smoothness can be measured with a Bekk smoothness tester. The Bekk smoothness tester is a tester for measuring a time required for a definite amount (10 ml) of air to pass through between a test piece and a glass surface under a reduced pressure, wherein the test piece is pressed to a highly smoothly finished circular glass plate having a hole at its center at a definite pressure (1 kg/cm$^2$).

The image reproducibility and the printing durability (i.e., press life) can be more improved by restricting the smoothness of the surface on the side adjacent to the light-sensitive layer of the support to the above described value. Such improving effects are obtained even if the light-sensitive layer having equal surface smoothness is provided, and it is considered that the increase in the smoothness of the surface of the support has improved adhesion between the support and the light-sensitive layer.

The expression "smooth surface of the support" as described above means a surface directly contacted with the light-sensitive layer. In other words, when the support has an under layer or an overcoat layer, the smooth surface indicates the surface of the under layer or overcoat layer provided on the support.

Thus, the surface condition of the light-sensitive layer can be controlled and fully kept without receiving the influence of surface roughness of the support used and as the result, it makes possible to more improve the image quality obtained.

The adjustment of the surface smoothness to the above described range can be made using various well-known methods. For instance, the Bekk smoothness of the support surface can be controlled by coating a substrate with a resin using a melt adhesion method or by employing a strengthened calender method utilizing highly smooth heated rollers.

In order to conduct image formation on the printing plate precursor according to the present invention, the surface of the light-sensitive layer of the printing plate precursor is directly exposed imagewise to ultraviolet ray, whereby the exposed area is converted to the hydrophilic condition and forms a non-image portion. On the other hand, the unexposed area maintains its hydrophobic condition and constitutes an image portion. For the purpose of ultraviolet ray exposure, a laser beam, for example, Xe:F excimer, He—Cd, $N_2$, or 4th harmonic wave of diode pumped Nd; YAG by OPO using BBO crystal is employed.

In the non-image portion, the contact angle of the surface of the light-sensitive layer with water is ordinarily not more than 20 degrees, preferably not more than 10 degree, and more preferably not more than 5 degrees.

The lithographic printing plate thus-obtained is mounted on a conventional offset printing machine to perform printing. Dampening water and printing ink used can be appropriately selected from those conventionally employed in the field of offset printing depending on the purpose.

According to the present invention, the lithographic printing plate can be reused. More specifically, after removing printing ink from the surface of the printing plate by an appropriate method, the printing plate is subjected to heat treatment preferably at temperature of from 130 to 200° C. for a period of from 1 to 5 hours, more preferably at temperature of from 150 to 200° C. for a period of from 1 to 3 hours, whereby the hydrophilic non-image portion returns to the inherent hydrophobic state. The resulting printing plate precursor is repeatedly employed for plate-making and printing.

Further, the light-sensitive layer of the lithographic printing plate precursor according to the present invention has strength sufficient for making resistance against wear and tear and enough difference in wettability between the image portion and the non-image portion and thus, after printing about 10,000 sheets is repeated 10 times, prints having clear images without background stain can be obtained.

The lithographic printing plate precursor according to the present invention comprising a light-sensitive layer containing fine anatase-type titanium oxide grains and a resin having a siloxane bond represented by the formula (I) can provide a lithographic printing plate upon imagewise irradiation with ultraviolet ray and the printing plate provides a large number of prints having clear images without background stain.

According to a method for the preparation of a lithographic printing plate using the lithographic printing plate precursor of the present invention, image formation and dry type desensitizing treatment can be conducted at once only by the ultraviolet ray imagewise exposure in a simple manner, and no development processing is necessary.

The light-sensitive layer prepared from a dispersion comprising anatase-type titanium oxide grains and a silane compound by the sol-gel method is particularly advantageous in view of film strength and uniform dispersion of the titanium oxide grains.

Moreover, since toner or ink is not employed for the image formation on the lithographic printing plate precursor according to the present invention, a lithographic printing plate precursor is regenerated by removing printing ink from the surface thereof and subjecting heat treatment to return the hydrophilic non-image portion to the inherent hydrophobic state.

The present invention will be described in greater detail with reference to the following examples, but the present invention should not be construed as being limited thereto.

EXAMPLE 1

Preparation of Lithographic Printing Plate Precursor

A composition having the following component was placed in a paint shaker (manufactured by Toyo Seiki Co., Ltd.) together with glass beads and dispersed for 60 minutes. Then, the glass beads were removed by filtration to obtain a dispersion.

| | |
|---|---|
| Photocatalyst Titanium Oxide Sol (30% aqueous solution) (Titanium Oxide Slurry STS-01 manufactured by Ishihara Sangyo Kaisha Ltd.) | 167 g |
| Tetramethoxysilane (manufactured by Shin-Etsu Chemical Co., Ltd.) | 50 g |
| Concentrated Hydrochloric Acid (manufactured by Wako Pure Chemical Industries, Ltd.) | 0.5 |
| Methanol | 883 g |

The dispersion was coated on a support for ELP-II Type Master (manufactured by Fuji Photo Film Co., Ltd.) used as an electrophotographic lithographic printing plate precursor for small-scale commercial printing using a wire bar and dried at 110° C. for 20 minutes to form a light-sensitive layer having a coating amount of 1 $g/m^2$, thereby obtaining a lithographic printing plate precursor.

Then, 2 μl of distilled water was put on the surface of the light-sensitive layer at room temperature (about 20° C.) and 30 seconds after, the contact angle of the surface of the light-sensitive layer with water was measured by a surface contact meter (CA-D manufactured by Kyowa Kaimen Kagaku Co., Ltd.). The value obtained was 55 degrees.

The lithographic printing plate precursor was directly exposed using a writing device having an He—Cd laser beam as a light source (50 mW; beam diameter: 20 μm; drum type) at a writing speed of 3 mm/sec to form an image.

The surface wettabilities of the non-image portion and the image portion (solid image portion) of the thus obtained lithographic printing plate were evaluated by the contact angle with water. The contact angle of the surface of the non-image portion with water which had been exposed with the laser beam was changed to 0 degree, and on the other hand, that of the image portion was 55 degrees which was the same as before the exposure.

The lithographic printing plate was mounted on a printing machine (Oliver Model 94 manufactured by Sakurai Seisakusho K. K.) and printing was performed on printing paper using black ink for offset printing and dampening water prepared by diluting SLM-OD (manufactured by Mitsubishi Paper Mills, Ltd.) 100 times with distilled water and placed in a dampening saucer.

The 10th print was picked up and the printed image thereon was visually observed using a magnifier of 20 magnifications. It was found that the non-image portion was free from background stain resulting from adhesion of printing ink and the uniformity of the solid image portion was highly satisfactory. Further, as a result of investigation of the print under an optical microscope of 200 magnifications, narrowing or cutting of fine lines and letters were not recognized and the image quality was excellent.

In the printing operations, more than 10,000 prints having the image quality equal to that of the 10th were obtained.

EXAMPLES 2 TO 8

Lithographic printing plate precursors were prepared in the same manner as in Example 1 except for changing the component of the resin for binder (i.e., tetramethoxysilane) to the silane compounds shown in Table 1 below, respectively.

TABLE 1

| Example | Component of Resin | A* | B** |
|---|---|---|---|
| 2 | Tetraethoxysilane | 55 | 0 |
| 3 | Methyltrimethoxysilane | 70 | 0 |
| 4 | 3-Hydroxypropyltrimethoxysilane | 70 | 0 |
| 5 | Phenyltrimethoxysilane | 75 | 0 |
| 6 | Tetramethoxysilane/Dimethyldimethoxysilane (1/1 in mole ratio) | 85 | 0 |
| 7 | Tetraethoxysilane/tert-Butyltrimethoxysilane (1/1 in mole ratio) | 75 | 0 |
| 8 | Trimethoxysilane | 75 | 0 |

A*: Contact angle of water with the surface of the image portion
B**: Contact angle of water with the surface of the non-image portion after exposure The image formation and offset printing were conducted in the same manner as in Example 1. The prints thus obtained had clear images without background stain in the non-image portion similar to those obtained in Example 1, the printing durability (i.e., press life) was good as 10,000 prints or more.

EXAMPLE 9

Preparation of Lithographic Printing Plate Precursor

A composition having the following component was placed in a paint shaker (manufactured by Toyo Seiki Co., Ltd.) together with glass beads and dispersed for 10 minutes. Then, the glass beads were removed by filtration to obtain a dispersion.

| | |
|---|---|
| Photocatalyst Titanium Oxide Powder (ST-01 manufactured by Ishihara Sangyo Kaisha Ltd.) | 75 g |
| Tetramethoxysilane (manufactured by Shin-Etsu Chemical Co., Ltd.) | 25 g |
| Concentrated Hydrochloric Acid (manufactured by Wako Pure Chemical Industries, Ltd.) | 0.5 g |
| Methanol | 1,000 g |

The dispersion was coated on a support for ELP-II Type Master (manufactured by Fuji Photo Film Co., Ltd.) used as an electrophotographic lithographic printing plate precursor for small-scale commercial printing using a wire bar and dried at 130° C. for 30 minutes to form a light-sensitive layer having a coating amount of 5 $g/m^2$, thereby obtaining a lithographic printing plate precursor.

Then, 2 μl of distilled water was put on the surface of the light-sensitive layer at room temperature (about 20° C.) and 30 seconds after, the contact angle of the surface of the light-sensitive layer with water was measured by a surface contact meter (CA-D manufactured by Kyowa Kaimen Kagaku Co., Ltd.). The value obtained was 55 degrees.

The lithographic printing plate precursor was subjected the laser beam exposure in the same manner as in Example 1 to form an image. The contact angle of the surface of the non-image portion with water was changed to 0 degree, and that of the image portion was 55 degrees which was the same as before the exposure.

Then, the offset printing was conducted in the same manner as in Example 1. The prints thus obtained had clear images without background stain in the non-image portion similar to those obtained in Example 1, and the printing durability was good as 10,000 prints or more.

EXAMPLES 10 TO 12

Lithographic printing plate precursors were prepared in the same manner as in Example 9 except for changing the mixing ratio of the titanium oxide powder to the component of the resin for binder (i.e., tetramethoxysilane) to those shown in Table 2 below, respectively.

TABLE 2

| Example | Mixing Ratio of Titanium Oxide Powder/Tetramethoxysilane | A* | B** |
|---|---|---|---|
| 10 | 50/50 | 55 | 0 |
| 11 | 85/15 | 70 | 0 |
| 12 | 30/70 | 50 | 0 |

A*: Contact angle of water with the surface of the image portion
B**: Contact angle of water with the surface of the non-image portion after exposure The image formation and offset printing were conducted in the same manner as in Example 1. The prints thus obtained had clear images without background stain in the non-image portion similar to those obtained in Example 9, the printing durability was good as 10,000 prints or more.

EXAMPLE 13

Preparation of Lithographic Printing Plate Precursor

A composition having the following component was placed in a paint shaker (manufactured by Toyo Seiki Co., Ltd.) together with glass beads and dispersed for 60 minutes. Then, the glass beads were removed by filtration to obtain a dispersion.

| | |
|---|---|
| Photocatalyst Titanium Oxide Sol (30% aqueous solution) (Titanium Oxide Slurry STS-01 manufactured by Ishihara Sangyo Kaisha Ltd.) | 167 g |
| Tetraethoxysilane (manufactured by Merck & Co.) | 25 g |
| Tetramethoxysilane (manufactured by Shin-Etsu Chemical Co., Ltd.) | 25 g |
| Concentrated Hydrochloric Acid (manufactured by Wako Pure Chemical Industries, Ltd.) | 0.5 g |
| Ethanol | 883 g |

The dispersion was coated on a degreased aluminum plate having a thickness of 150 $\mu$m using a wire bar and dried at 110° C. for 20 minutes to form a light-sensitive layer having a coating amount of 3 g/m$^2$, thereby obtaining a lithographic printing plate precursor.

Then, 2 $\mu$l of distilled water was put on the surface of the light-sensitive layer at room temperature (about 20° C.) and 30 seconds after, the contact angle of the surface of the light-sensitive layer with water was measured by a surface contact meter (CA-D manufactured by Kyowa Kaimen Kagaku Co., Ltd.). The value obtained was 60 degrees.

The lithographic printing plate precursor was subjected the laser beam exposure in the same manner as in Example 1 to form an image. The contact angle of the surface of the non-image portion with water was changed to 0 degree, and that of the image portion was 60 degrees which was the same as before the exposure.

Then, the offset printing was conducted in the same manner as in Example 1. The prints thus obtained had clear images without background stain in the non-image portion similar to those obtained in Example 1, and the printing durability was good as 10,000 prints or more.

EXAMPLES 14 TO 18

Lithographic printing plate precursors were prepared in the same manner as in Example 13 except for using the component of the resin for binder shown in Table 3 below in place of 25 g of tetraethoxysilane, respectively.

TABLE 3

| Example | Component of Resin | A* | B** |
|---|---|---|---|
| 14 | Tetraisopropoxytitanium/Tetraethoxysilane (12.5 g/12.5 g) | 55 | 0 |
| 15 | Tetra-n-butoxytitanium/Tetraerthoxy-silane (12.5 g/12.5 g) | 60 | 0 |
| 16 | Tetraisopropoxytitanium/Methyltrimethoxy-titanium/Tetraetoxysilane (6.25 g/6.25 g/12.5 g) | 70 | 0 |
| 17 | Nickel Tetraacetate/Methyltrimethoxy-titanium/Tetraetoxysilane (6.25 g/6.25 g/12.5 g) | 60 | 0 |
| 18 | Tetraethoxyzirconia/Methyltrimethoxy-titanium/Tetraetoxysilane (6.25 g/6.25 g/12.5 g) | 70 | 0 |

A*: Contact angle of water with the surface of the image portion
B**: Contact angle of water with the surface of the non-image portion after exposure The image formation and offset printing were conducted in the same manner as in Example 1. The prints thus obtained had clear images without background stain in the non-image portion similar to those obtained in Example 13, and the printing durability was good as 10,000 prints or more.

EXAMPLE 19

A lithographic printing plate precursor was prepared in the same manner as in Example 13 except for using a polyethylene terephthalate film having a thickness of 100 $\mu$m which had been subjected to corona treatment as the support.

The image formation and offset printing were conducted in the same manner as in Example 1. The prints thus obtained had clear images without background stain in the non-image portion similar to those obtained in Example 13, and the printing durability was good as 10,000 prints or more.

EXAMPLE 20

Preparation of Lithographic Printing Plate Precursor

A composition having the following component was placed in a paint shaker (manufactured by Toyo Seiki Co., Ltd.) together with glass beads and dispersed for 10 minutes. Then, the glass beads were removed by filtration to obtain a dispersion.

| | |
|---|---|
| Photocatalyst Titanium Oxide Sol (30% aqueous solution)(Titanium Oxide Slurry STS-02 manufactured by Ishihara Sangyo Kaisha Ltd.) | 150 g |
| Tetraethoxysilane (manufactured by Shin-Etsu Chemical Co., Ltd.) | 20 g |
| Alumina Sol | 15 g |
| Ion-Exchanged Water | 1,200 g |

The dispersion was coated on a degreased SUS plate having a thickness of 150 $\mu$m using a wire bar and dried at 110° C. for 20 minutes to form a light-sensitive layer having a coating amount of 3 g/m²₁ thereby obtaining a lithographic printing plate precursor.

Then, 2 μl of distilled water was put on the surface of the light-sensitive layer at room temperature (about 20° C.) and 30 seconds after, the contact angle of the surface of the light-sensitive layer with water was measured by a surface contact meter (CA-D manufactured by Kyowa Kaimen Kagaku Co., Ltd.). The value obtained was 70 degrees.

The lithographic printing plate precursor was subjected the laser beam exposure in the same manner as in Example 1 to form an image. The contact angle of the surface of the non-image portion with water was changed to 0 degree, and that of the image portion was 70 degrees which was the same as before the exposure.

Then, the offset printing was conducted in the same manner as in Example 1. The prints thus obtained had clear images without background stain in the non-image portion similar to those obtained in Example 1, and the printing durability was good as 10,000 prints or more.

While the invention has been described in detail and with reference to specific embodiments thereof, it will be apparent to one skilled in the art that various changes and modifications can be made therein without departing the spirit and scope thereof.

What is claimed is:

1. A lithographic printing plate precursor for ultraviolet ray exposure comprising a support having provided thereon a light-sensitive, hydrophobic layer containing fine anatase-type titanium oxide grains and a resin having a siloxane bond represented by the following formula (I):

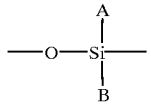
(I)

wherein A and B, which may be the same or different, each represents —O—, a hydrogen atom, a hydrocarbon group or a heterocyclic group.

2. The lithographic printing plate precursor for ultraviolet ray exposure as claimed in claim 1, wherein a surface of the light-sensitive layer has a contact angle with water of 30 degrees or more.

3. The lithographic printing plate precursor for ultraviolet ray exposure as claimed in claim 1, wherein the light-sensitive layer contains the fine anatase-type titanium oxide grains in a range of from 30 to 95% by weight.

4. The lithographic printing plate precursor for ultraviolet ray exposure as claimed in claim 1, wherein an average particle size of the fine anataze-type titanium oxide grains is from 5 to 500 nm.

5. The lithographic printing plate precursor for ultraviolet ray exposure as claimed in claim 1, wherein the light-sensitive layer is a layer formed from a dispersion comprising the anatase-type titanium oxide grains and at least one silane compound represented by the following formula (II) by a sol-gel method:

(II)

wherein R⁰ represents a hydrogen atom, a hydrocarbon group or a heterocyclic group; Y represents a hydrogen atom, a halogen atom or a group of formula —OR¹, —OCOR² or —N(R³)(R⁴), wherein R¹ and R² each represents a hydrocarbon group, and R³ and R⁴, which may be the same or different, each represents a hydrogen atom or a hydrocarbon group; and n represents 0, 1, 2 or 3.

6. The lithographic printing plate precursor for ultraviolet ray exposure as claimed in claim 1, wherein a thickness of the light-sensitive layer is from 0.2 to 10 μm.

7. The lithographic printing plate precursor for ultraviolet ray exposure as claimed in claim 1, wherein a surface of the support adjacent to the light-sensitive layer has the Bekk smoothness of 300 (second/10 ml) or more.

8. A method for the preparation of a lithographic printing plate comprising exposing imagewise a lithographic printing plate precursor for ultraviolet ray exposure comprising a support having provided thereon a light-sensitive, hydrophobic layer containing fine anatase-type titanium oxide grains and a resin having a siloxane bond represented by the following formula (I):

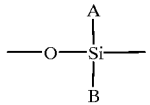
(I)

wherein A and B, which may be the same or different, each represents —O—, a hydrogen atom, a hydrocarbon group or a heterocyclic group to ultraviolet ray to render a surface of the imagewise exposed area of the light-sensitive layer hydrophilic.

9. The method for the preparation of a lithographic printing plate as claimed in claim 8, wherein the surface of the imagewise exposed area of the light-sensitive layer has a contact angle with water of not more than 20 degrees.

* * * * *